United States Patent [19]

Kohno et al.

[11] Patent Number: 4,963,983

[45] Date of Patent: Oct. 16, 1990

[54] CCD IMAGE SENSOR WITH VERTICAL OVERFLOW DRAIN

[75] Inventors: Akiyoshi Kohno; Atsushi Mikoshiba, both of Tokyo, Japan

[73] Assignee: NEC Corporation, Tokyo, Japan

[21] Appl. No.: 447,468

[22] Filed: Dec. 7, 1989

[30] Foreign Application Priority Data

Dec. 7, 1988 [JP] Japan ................................ 63-310381

[51] Int. Cl.$^5$ .......................................... H04N 5/228
[52] U.S. Cl. ........................... 358/213.31; 358/213.23; 358/213.19; 257/24
[58] Field of Search ...................... 358/213.19, 213.23, 358/213.11, 213.31; 357/24 LR

[56] References Cited

U.S. PATENT DOCUMENTS

| 4,849,814 | 7/1989 | Van De Skeg | 358/213.31 |
| 4,875,100 | 10/1989 | Yonemoto et al. | 358/213.31 |
| 4,912,560 | 3/1990 | Osawa et al. | 358/213.31 |

*Primary Examiner*—James J. Groody
*Assistant Examiner*—W. Clements
*Attorney, Agent, or Firm*—Sughrue, Mion, Zinn, Macpeak & Seas

[57] ABSTRACT

An image sensor is fabricated on a semiconductor substrate and comprises a well formed in the substrate, photo sensing elements formed in the well, vertical shift registers coupled to the columns of the photo sensing elements, a horizontal shift register coupled to the vertical shift registers and a photo shield plate exposing the photo sensing elements to optical images, in which the photo shield plate remains in a first voltage level for restriction of production of ineffectual electric charges but is biased to a second voltage level for promoting the production of effectual electric charges after the semiconductor substrate is biased so as to allow a punch-through phenomenon to take place for discharging the ineffectual electric charges from the photo-sensing elements to the substrate, so that a variable electronic shutter is achieved under biasing the photo shield plate and the substrate without an extremely high voltage level.

7 Claims, 11 Drawing Sheets

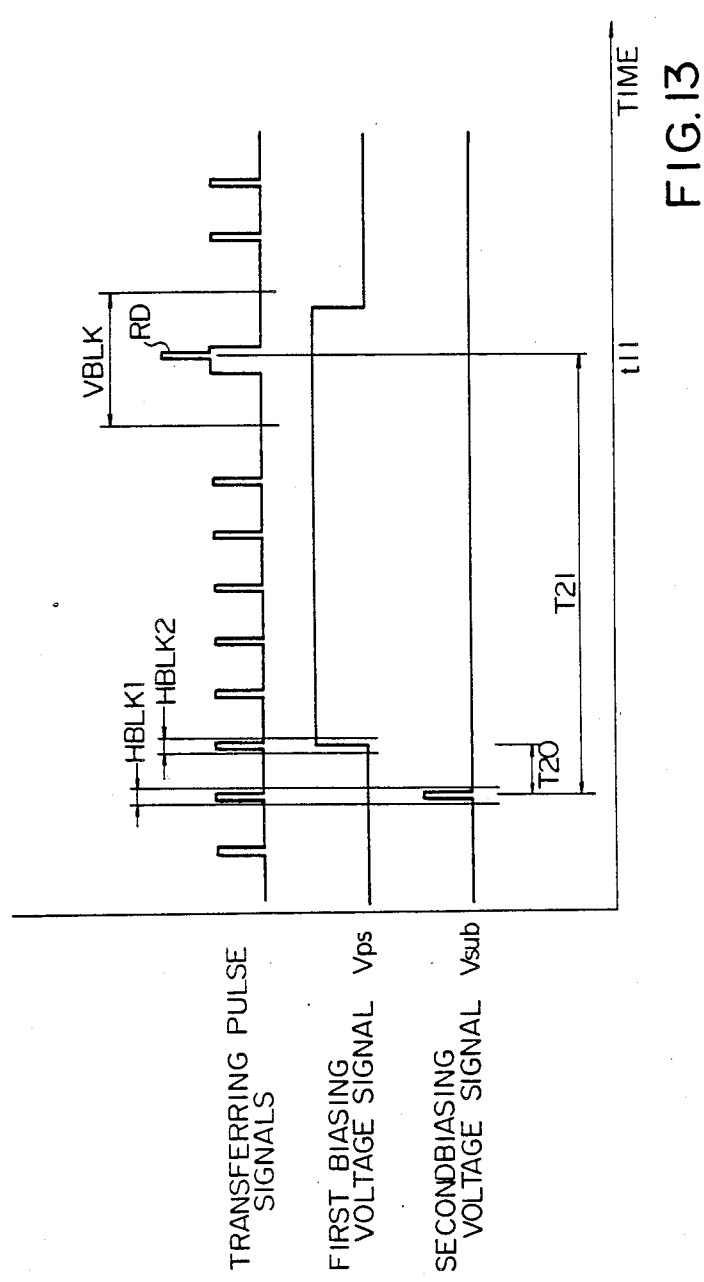

CCD IMAGE SENSOR WITH VERTICAL OVERFLOW DRAIN

FIELD OF THE INVENTION

This invention relates to a charge-coupled device (which is hereinbelow abbreviated as "CCD") and, more particularly, to a vertical overflow drain incorporated in the CCD image sensor capable of established into an electronic shutter mode of operation.

DESCRIPTION OF THE RELATED ART

A prior art charge coupled device of the interline transfer type is used for implementation of an image sensor, and the image sensor largely comprises photo diode array associated with a plurality of vertical shift registers each implemented by a CCD device which in turn is coupled to a horizontal shift registor also implemented by a CCD device. The image sensor is established into an accumulating mode and a read out mode of operation, and an optical image is converted into electric charges during the accumulating mode of operation. While the accumulated electric charges are read out from the photo diode array through the vertical shift registers in a single vertical blanking period, the subsequent optical image is converted into fresh electric charges. According to the NTSC (National Television System Committee) color system, the accumulating time period is adopted to be a sixtieth second, and, for this reason, the image sensor hardly reproduces an optical image from an object moving at a high speed without making an image on the display vague. In order to cope with this drawback, an electronic shutter mode of operation is proposed for shortening the effective accumulating time period.

One of the image sensor with the electronic shutter mode of operation is disclosed in a magazine entitled as "Video alpha", published by Photo Industry Publishing Company, 1987 August, pages 145 to 148. For better understanding of the Applicant's invention, the image sensor disclosed in the magazine is briefly described with reference to FIGS. 1 and 2.

Referring to FIG. 1 of the drawings, the image sensor largely comprises a photo diode array PD having a plurality of photo diodes arranged in rows and columns, a plurality of vertical shift registors VSR coupled to the columns of the photo diodes, respectively, a horizontal shift registor HSR coupled to the vertical shift registors VSR, and an overflow drain OFD coupled to the opposite ends of the vertical shift registors VSR.

The behavior of the image sensor shown in FIG. 1 is described with reference to FIG. 2 where the timing chart for the image sensor with the electronic shutter mode of operation is compared with a timing chart for the conventional image sensor without the electronic shutter mode of operation. The conventional image sensor without the electronic shutter mode of operation is responsive to a single read out pulse RD, and, thereafter, all of the electronic charges are transferred in synchronization with a series of vertical transferring pulses VPL between two vertical blanking periods. Thus, the accumulated electric charges are concurrently read out from the photo diodes, and the electric charges are conveyed in the forward direction only.

On the other hand, the conventional image sensor with the electronic shutter mode of operation is responsive to two read out pulses RD1 and RD2 intermittingly produced in a single vertical blanking period for achieving an electronic shutter mode of operation. When the first read out pulse RD1 takes place, the photo diodes discharge the respective ineffectual electric charges to the vertical shift registers VSR, and the ineffectual electric charges are swept to the overflow drain OFD in the presence of the high speed reversely transferring pulses 21. While sweeping the ineffectual electric charges, the photo diodes PD accumulate fresh or effectual electric charges in the presence of an optical image. Upon completion of the sweeping operation, the second read out pulse RD2 takes place for allowing the photo diodes PD to discharge the electric charges to the vertical shift registers VSR, and the vertical shift registers transfer the effectual electric charges to the outside thereof in synchronization with the vertical transferring pulses VPL. Thus, the optical image is effectively converted into electric charges during a time period T1 between the first and second read out pulses RD1 and RD2. However, a shutter speed is fixedly defined by the time period T1.

The image sensor thus arranged is fairly responsive to an optical image fed from a moving object, however, the image sensor can not respond to variation of illuminance due to the shutter speed fixed to a certain value.

In order to cope with the drawback inherent in the image sensor of the type shown in FIG. 1, a variable electronic shutter is proposed, and an image sensor of the type having the variable electronic shutter mode of operation is illustrated in FIG. 3. The image sensor shown in FIG. 3 comprises a photo diode array PD, a plurality of vertical shift registers VSR each implemented by a CCD, a horizontal shift registor HSR also implemented by a CCD, an overflow drain OFD and a plurality of accumulation memories AM provided in association with the vertical shift registers VSR, respectively. The time period T1 is variable and ranges from a two hundred and fiftieth second to a thousandth second by virtue of the accumulation memories AM. However, a large number of memory stages are necessary for a wide range of the shutter speed, and a large amount of the real estate is consumed by the accumulating memories AM. For this reason, one of the problems inherent in the image sensor shown in FIG. 3 is the enlarged semiconductor chip.

Moreover, the accumulation memories Am are causative of a vague image reproduced on an associated display screen. Namely, if the number of the memory stages is increased for achievement of a broad range of the shutter speed, the transferring pulse needs to be increased in the frequency for the completion of an transferring operation within a predetermined time period. The more memory stages, the less amount of the electric charges transferred from stage to stage. This results in the vague image on the display screen.

Still another prior art image sensor is disclosed by Hamazaki et al in "Interline Type CCD with High Sensitivity Responsive to the Minimum Illuminance of 51×", Nikkei Microdevices, 1987 October, pages 60 to 67. The image sensor reported by Hamazaki is capable of establishment into a variable electronic shutter mode of operation, and is characterized by a vertical overflow drain for sweeping ineffectual electric charges into the semiconductor substrate where the image sensor is fabricated. In the image sensor provided with the vertical overflow drain, there is provided a hole accumulator underneath photo diodes, and a biasing voltage level applied to the semiconductor substrate is shifted between the electric charge accumulation mode and an electronic shutter mode of operation. In the electric charge accumulation mode of operation, a potential barrier takes place between the photo diodes and the semiconductor substrate, so that electric charges produced in the presence of an optical radiation are hardly escaped over the potential barrier. However, if the biasing voltage level at the semiconductor substrate is changed for the electronic shutter mode of operation, the potential barrier is removed so that the electric charges are discharged into the semiconductor substrate.

However, a problem is encountered in the prior art image sensor provided with the vertical overflow drain in that saturation irregularity tends to take place. In detail, the maximum amounts of the electric charges accumulated in the respective photo diodes should be strictly controllable because the electric charges accumulated in the photo diodes are perfectly discharged upon increasing the biasing voltage level to an extremely high level. This means that the controlling dependency of the maximum amount of the electric charges accumulated should be enhanced in terms of the biasing voltage level at the semiconductor substrate. However, if the controlling dependency is enhanced in terms of the biasing voltage level at the semiconductor substrate, the capacitances coupled to the photo diodes are increased, and irregularity tends to takes place in the capacitance because uniformity in impurity concentration is hardly achieved throughout the semiconductor substrate. This results in the irregularity of the saturation level which in turn results in deterioration of the anti-blooming characteristics.

SUMMARY OF THE INVENTION

It is therefore an important object of the present invention to provide an image sensor which is fabricated on a relatively small semiconductor chip.

It is also an important object of the present invention to provide an image sensor which can reproduce clear images on an associated display screen.

It is another important object of the present invention to provide an image sensor which achieves a variable electronic shutter mode of operation without application of an extremely high voltage level to a semiconductor substrate.

To accomplish these objects, the present invention proposes to cause the punch-through phenomenon to take place for discharging the electric charges into the substrate, then shifting the voltage level at the photo shield plate to a certain voltage level for producing much electric charges.

In accordance with the present invention, there is provided a image sensor fabricated on a semiconductor substrate of a first conductivity type and having at least an electronic shutter mode and a charge transferring mode of operation, comprising: (a) a plurality of photo sensing elements arranged in rows and columns and operative to accumulate effectual electric charges in the electronic shutter mode of operation and ineffectual electric charges out of the electronic shutter mode of operation in the presence of optical images, the photo sensing elements being respectively formed by a plurality of impurity regions of the first conductivity type defined in a well of a second conductivity type provided in the semiconductor substrate, the second conductivity type being opposite to the first conductivity type; (b) a plurality of vertical shift registers coupled to the columns of the photo sensing elements, respectively, and operative to receive the effectual electric charges from the photo sensing elements in the presence of a read out signal produced in a vertical blanking time period and to transfer the effectual electric charges in response to a multi-phase vertical transferring signal in the charge transferring mode of operation, the vertical shift registers being formed in the well; (c) a horizontal shift registor coupled to the vertical shift registers for transferring the effectual electric charges fed from the vertical shift registers in response to a multiple-phase horizontal transferring signal; and (d) a conductive photo shield plate provided over the well an having an opening exposing the photo sensing elements to the optical images, in which the image sensor is provided in association with a biasing voltage controlling unit responsive to a vertical driving signal and a horizontal driving signal and operative to produce a first biasing voltage signal fed to the photo shield plate and a second biasing voltage signal fed to the semiconductor substrate, the first biasing voltage signal shifting its voltage level from a first level to a second level at a first time and from the second level to the first level at a second time, the second biasing voltage signal momentarily shifting its voltage level between a third level and a fourth level at a third time so as to allow a punch-through phenomenon to take place between the semiconductor substrate and the photo sensing elements for discharging the ineffectual electric charges into the semiconductor substrate, the image sensor entering into the electronic shutter mode of operation from the third time to the second time, and in which the first level restricts the production of ineffectual electric charges but the second level promotes the production of the effectual electric charges.

BRIEF DESCRIPTION OF THE DRAWINGS

The features and advantages of an image sensor according to the present invention will be more clearly understood from the following description taken in conjunction with the accompanying drawings in which:

FIG. 13 is a timing chart showing the first and second biasing voltage signals produced in the biasing voltage controlling circuit shown in FIG. 12.

PRINCIPLE WHICH THE PRESENT INVENTION IS BASED ON

Figure 1:
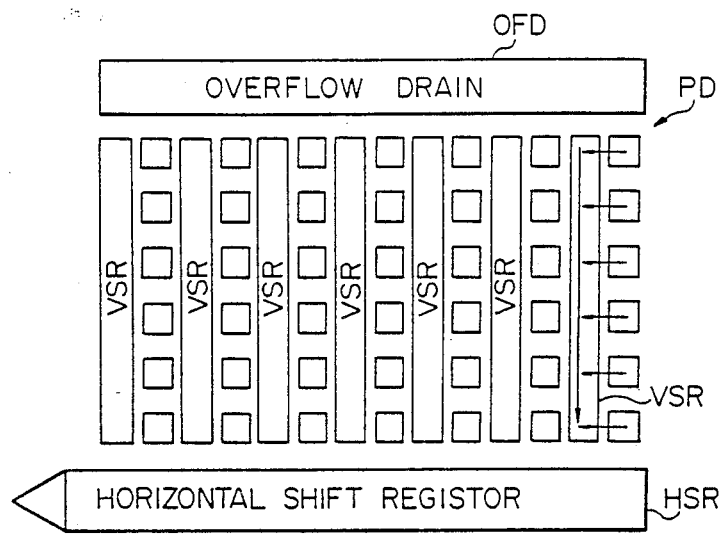
FIG. 1 is a plan view showing the layout of a prior art image sensor provided with an electronic shutter mode of operation.
Figure 2:
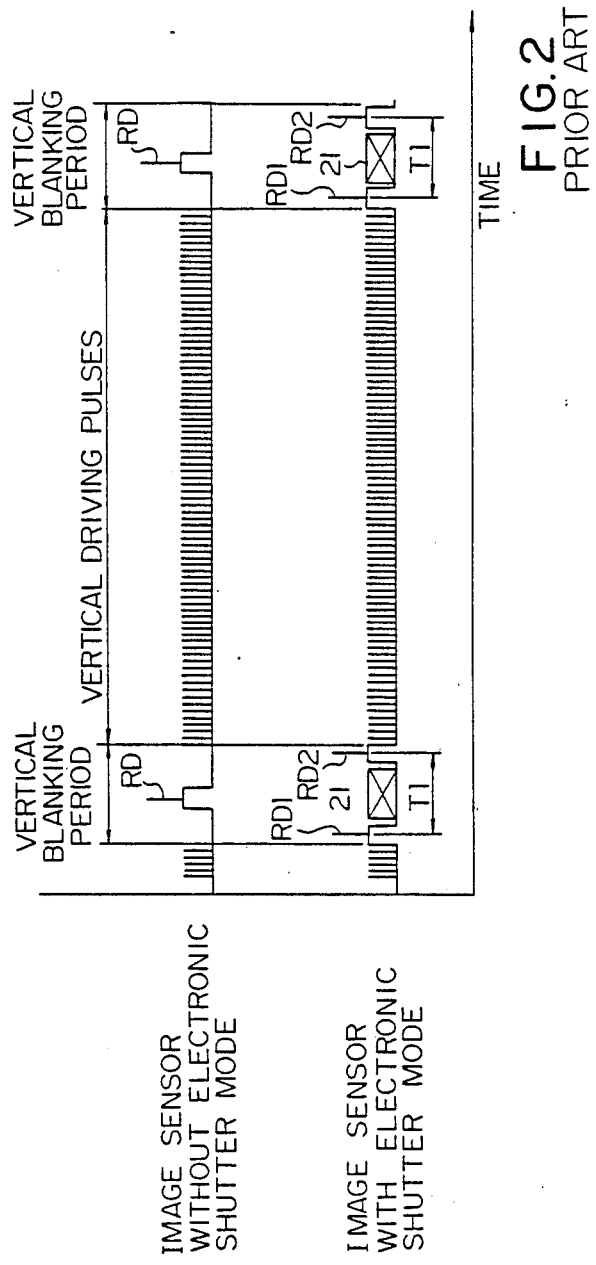
FIG. 2 is a diagram showing the waveforms of essential signals in a composite manner which are produced in the image sensor with the electronic shutter mode of operation and an image sensor without any electronic shutter mode of operation.
Figure 3:
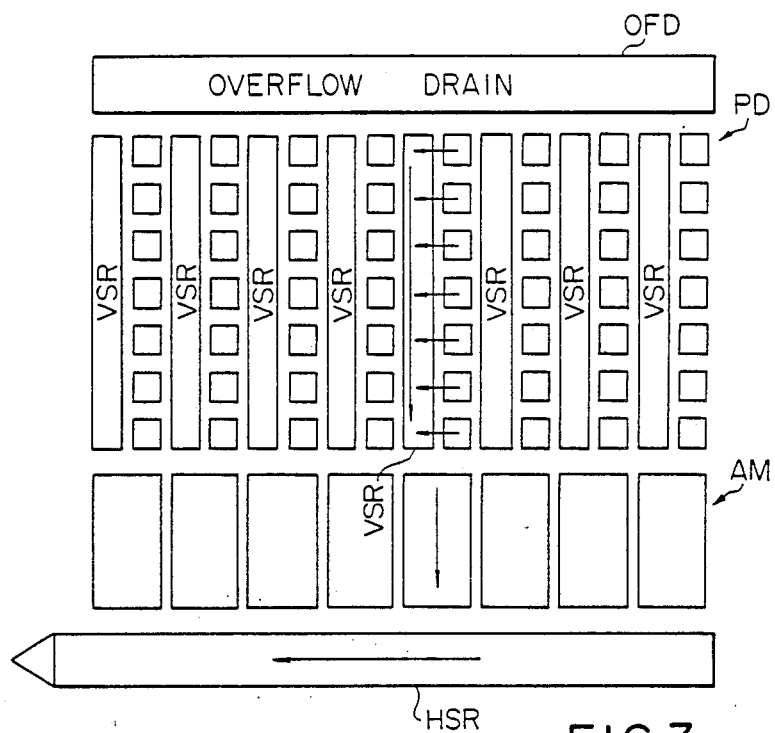
FIG. 3 is a plan view showing the layout of another prior art image sensor with a variable electronic shutter mode of operation.
Figure 4:
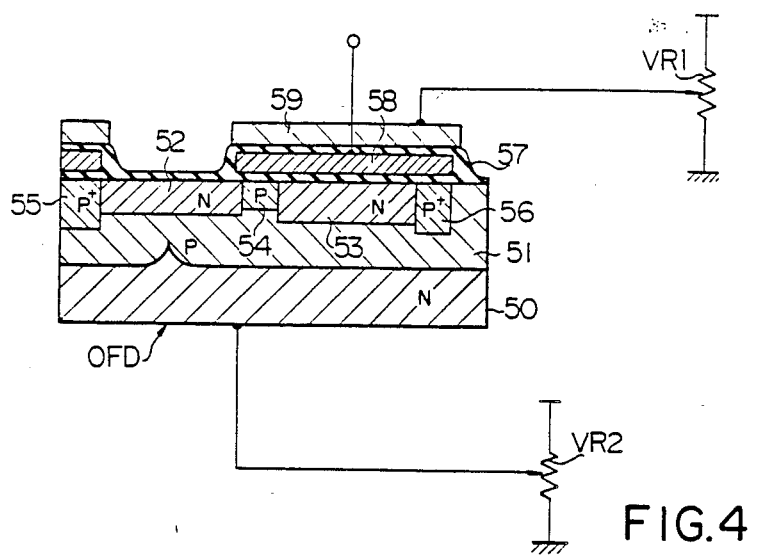
FIG. 4 is a view showing, in a modeled form, the arrangement of an image sensor arranged in accordance with a principle where the present invention is based.

Referring to FIG. 4 of the drawings, an image sensor is fabricated on an n-type semiconductor substrate 50, and in the semiconductor substrate 50 is formed a p-type well 51 where two n-type impurity regions 52 and 53 are formed and spaced from each other by a heavily doped p-type impurity region 54. The n-type impurity region 52 provides a photo diode together with the p-type well 51, and the n-type impurity region 53 serves as a single transferring stage of a vertical shift register The n-type impurity region 52, the p-type well 51 and the n-type semiconductor substrate 50 form in combination an n-p-n structure for a vertical overflow drain OFD. Heavily doped p-type impurity regions 55 and 56 provide channel stoppers, respectively. The upper surface of the semiconductor substrate 50 is covered with an insulating film 57 of a silicon oxide, and a transferring electrode 58 is formed in the insulating film 57 The transferring electrode 58 is supplied with a read out signal, and a photo shield plate 59 is provided on the insulating film 57. The photo shield plate 59 exposes the photo diodes to an optical radiation carrying an image, however, the other area is covered with the photo shield plate 59. The photo diode is perfectly depleted in the operation, and a floating photo shield plate is liable to be unstable. This is one of the reasons why the photo shield plate 59 needs to be biased as shown in FIG. 4.

Figure 5:
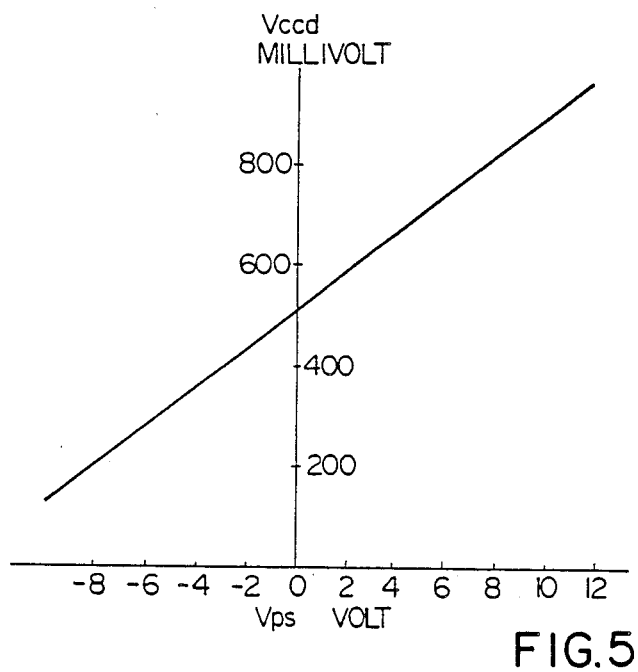
FIG. 5 is a graph showing the output voltage level of the image sensor shown in FIG. 4 in terms of the biasing voltage level at the photo shield plate.
Figure 6:
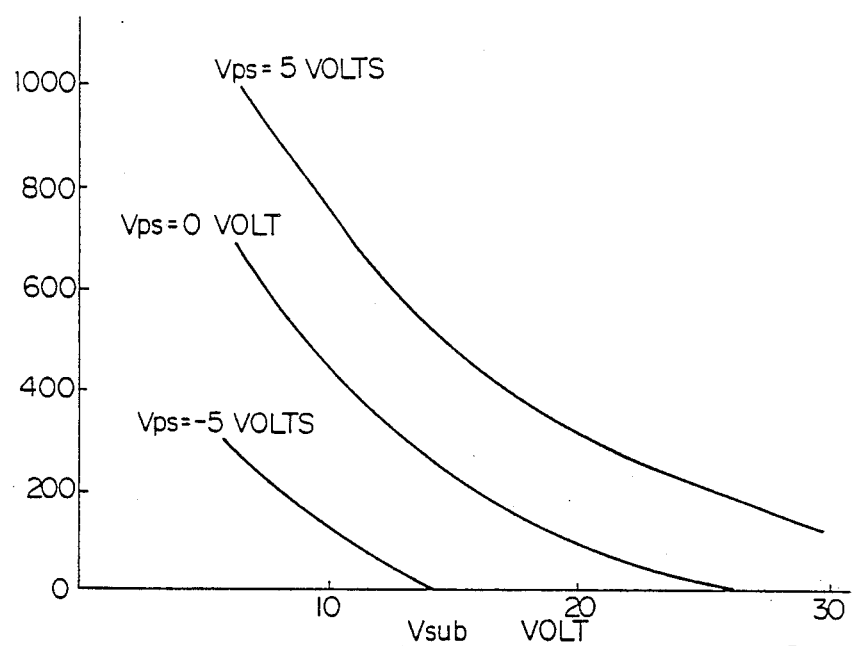
FIG. 6 is a graph showing the output voltage level of the image sensor shown in FIG. 4 in terms of the biasing voltage level at the semiconductor substrate.

Assuming now that the photo shield plate 59 and the semiconductor substrate 50 are respectively coupled to variable resistors VR1 and VR2, an output voltage level Vccd of the image sensor is directly proportional to the biasing voltage level Vps at the photo shield plate 59 under a constant biasing voltage level Vsub at the semiconductor substrate 50, but is decreased by increasing the biasing voltage level Vsub at the semiconductor substrate 50 under the constant biasing voltage level Vps at the photo shield plate 59. FIG. 5 shows the output voltage level Vccd of the image sensor in terms of the biasing voltage level Vps at the photo shield plate 59 under the biasing voltage level Vsub of about 10 volts. On the other hand, the relationship between the output voltage level Vccd and the biasing voltage level Vps is illustrated in FIG. 6. The biasing voltage Vsub to the output voltage Vccd characteristics are further affected by the biasing voltage level Vps at the photo shield plate 59.

Figure 7:
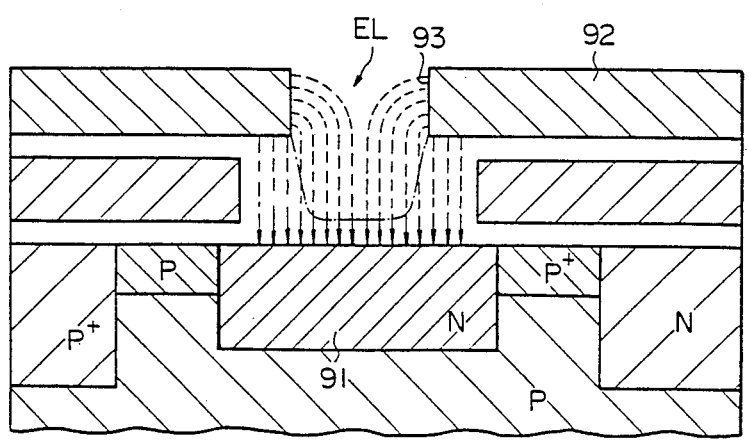
FIG. 7 is a cross sectional view of an image sensor showing the photo diode affected by the electric lines of force from the photo shield plate.
Figure 8:
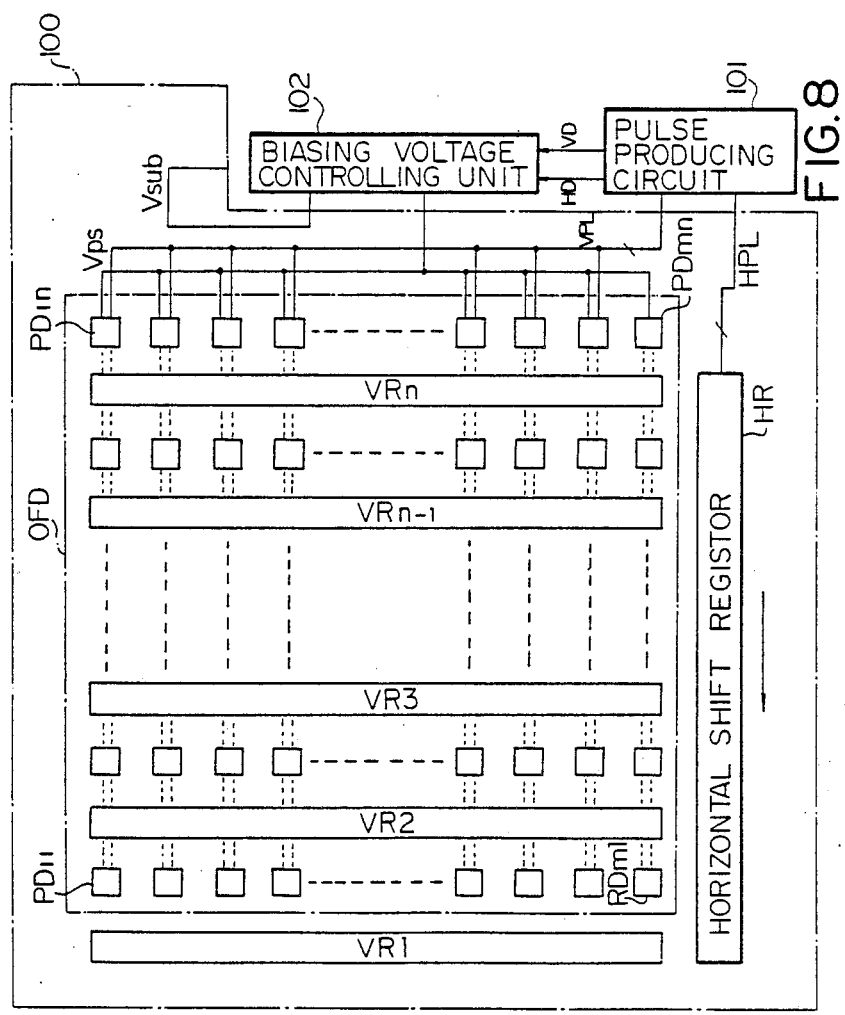
FIG. 8 is a block diagram showing the arrangement of an image sensor embodying the present invention.

The reason why the output voltage level Vccd is directly proportional to the biasing voltage level Vps is that the amount of the electric charges accumulated in a photo diode 91 is affected by the electric lines EL of force extending from a photo shield plate 92 as shown in FIG. 7. This phenomenon is derived from the fact that a ratio of open area in the photo shield plate 92 is so small and the photo shield plate 59 is so thick than t the electric lines EL of force can perfectly cover the surface of the photo diode 91, which allows the photo shield plate 92 to be assumed to cover the photo diode 91 in spite of the opening 93.

As described hereinbefore, the vertical overflow drain OFD is formed in the n-p-n structure, and a punch through phenomenon takes place under selection of the biasing voltage levels Vps and Vsub because the junction between the n-type impurity region 52 and the p-type well is fixed in potential level by virtue of the combination of the capacitances due to the biasing voltages Vps and Vsub. If the punch through phenomenon takes place, the electric charges accumulated in the photo diode are swept into the semiconductor substrate. Thus, the vertical overflow drain OFD is implemented by the simple n-p-n structure without any hole accumulating layer, and, for this reason, the image sensor according to the present invention is easy for fabrication.

DESCRIPTION OF THE PREFERRED EMBODIMENTS

First embodiment

Figure 10:
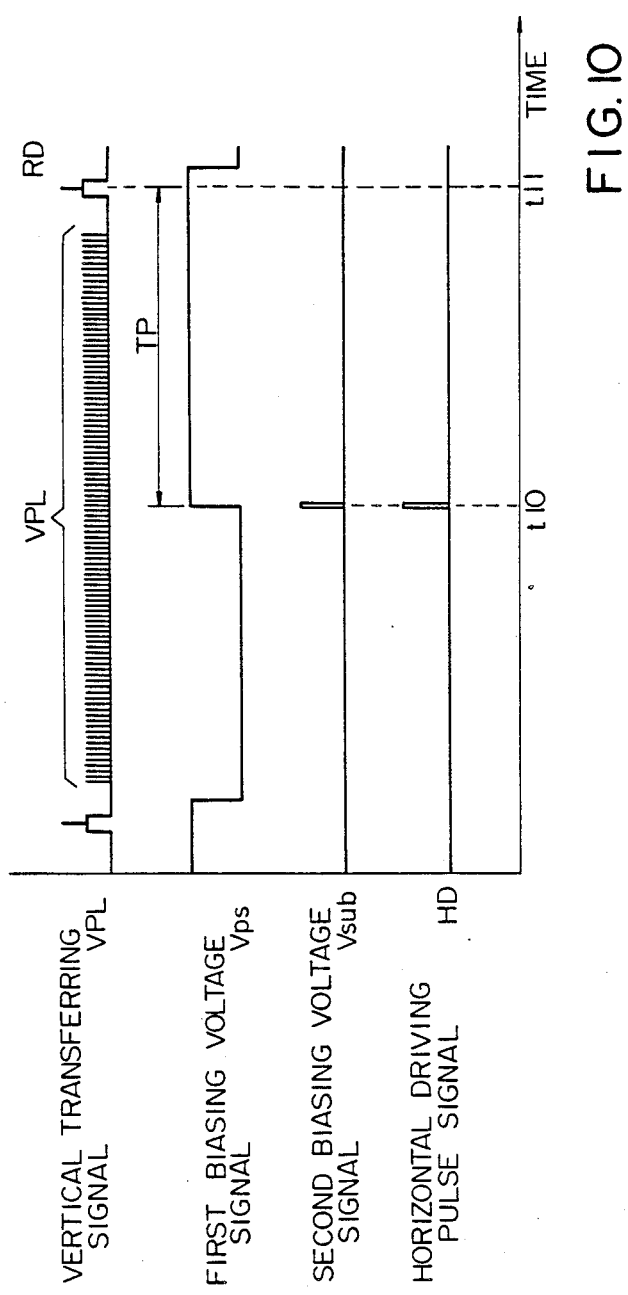
FIG. 10 is a timing chart showing the essential signals produced in the image sensor shown in FIG. 9.

Referring first to FIG. 10 of the drawings, an image sensor embodying the present invention is fabricated on an n-type silicon substrate 100, and comprises a plurality of photo sensing elements implemented by photo diodes PD11, PD1n, . . . , PDm1 AND PDmn, a plurality of vertical shift registers VR1 to VRn associated with the columns of the photo diodes PD11 to PDmn, respectively, a horizontal shift register HR coupled to the vertical shift registers VR1 to VRn and a vertical overflow drain OFD described hereinbelow in detail. In this instance, all of the vertical shift registers VR1 to VRn and the horizontal shift register HR are implemented by CCDs, respectively.

The image sensor thus arranged is associated with a pulse producing circuit 101 as well as a biasing voltage controlling unit 102, and the pulse producing circuit supplies a multiple-phase vertical transferring pulse signal VPL and a multiple-phase horizontal transferring pulse signal HPL to the vertical shift registers VR1 to VRn and the horizontal shift register HR, respectively. The biasing voltage controlling unit 102 is responsive to a vertical driving signal VD and a horizontal driving signal HD and produces a first biasing voltage signal Vps and a second biasing voltage signal Vsub, respectively. The first biasing voltage signal Vps is supplied to the photo diodes PD11 to PDmn, but the second biasing voltage signal Vsub is applied to the silicon substrate 100.

Figure 9:
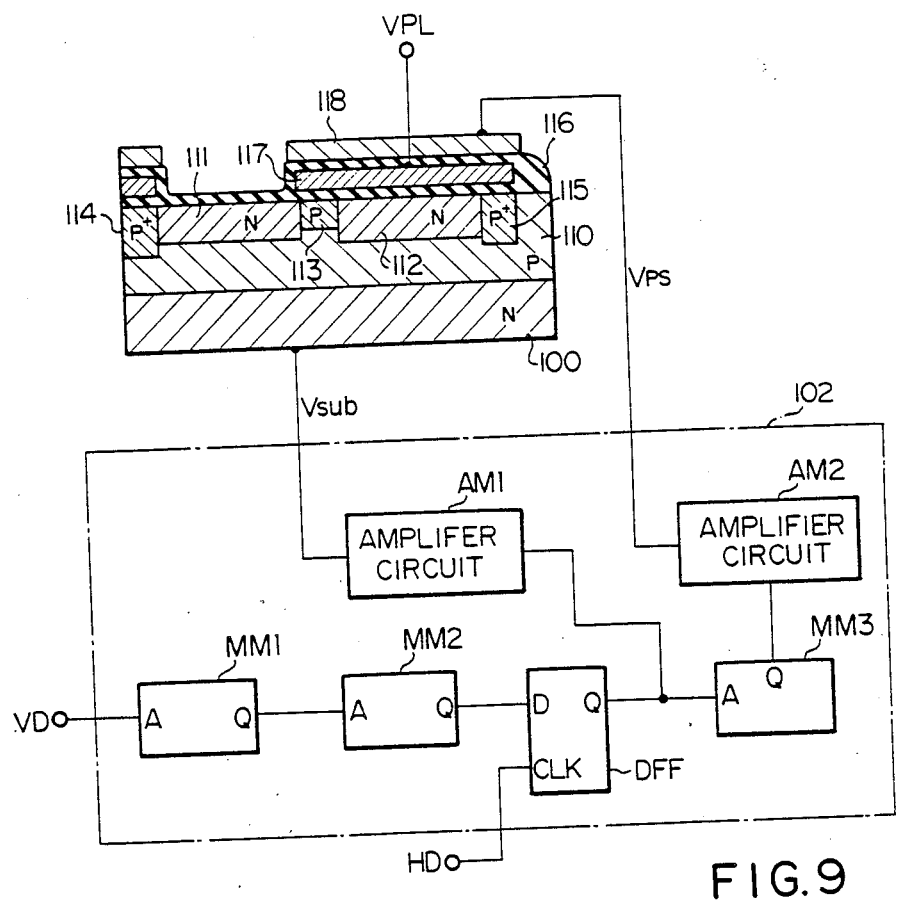
FIG. 9 is a view showing the structure of a part of the image sensor associated with the biasing voltage controlling unit.

Turning to FIG. 9 of the drawings, a p-type well 110 is formed in the silicon substrate 100, and two n-type impurity regions 111 and 112 are formed in the p-type well in a spacing relation ship from one another by a p-type impurity region 113. The n-type impurity region 111 forms one of the photo diodes PD11 to PDmn together with the p-type well 110, but the n-type impurity region 112 provides one of the stages of the vertical shift register VR. Though not shown in FIG. 9, a large number of n-type impurity regions are formed for the photo diodes PD11 to PDmn and the vertical and horizontal registors VR1 to VRn and HR. On both sides of the combination of the photo diode and the vertical shift register VR are further provided heavily doped impurity regions 114 and 115 which serve as channel stoppers, respectively. The n-type silicon substrate 100, the p-type well 110 and each of the n-type impurity region such as the region 111 as a whole provide an n-p-n structure which serves as a vertical overflow drain OFD.

The entire structure is covered with an insulating film 116 of a silicon oxide, and a transferring electrodes including an electrode 117 are formed in the insulating film 116. The transferring electrodes such as the electrode 117 are coupled to the pulse producing unit 101, and the multiple-phase vertical transferring pulse signal VPL is periodically supplied thereto. On the insulating film 116 is formed a conductive photo shield plate 118 which is coupled to the biasing voltage controlling unit 102 so that the first biasing voltage signal Vps is applied to the conductive photo shield plate 118.

The biasing voltage controlling circuit 102 comprises three monostable multivibrator circuits MM1, MM2 and MM3, a D-type latch circuit DFF and two amplifier circuits AM1 and AM2. The vertical driving pulse signal VD is supplied from the pulse producing circuit 101 to the input node of the first monostable multivibrator circuit MM1, and the high level output signal is produced for a predetermined time period. The high level output signal is supplied to the second monostable multivibrator circuit MM2, and the second monostable multivibrator circuit MM2 also produces a high level output signal which is fed to the D-input node of the latch circuit DFF. When the latch circuit DFF is triggered with the horizontal driving pulse signal HD, the high level output signal of the second monostable multivibrator circuit MM2 is latched by the D-type latch circuit so as to produce a high level output signal at the output node Q thereof. The high level output signal at the node Q is supplied in parallel to the first amplifier circuit AM1 and the third monostable multivibrator circuit MM3. The first amplifier circuit is supplied with the high level output signal of the latch circuit DFF and produces the second biasing voltage signal Vsub. On the other hand, the third monostable multivibrator circuit MM3 produces a high level output signal for a predetermined time period, and the high level output signal causes the second amplifier circuit AM2 to produce the first biasing voltage signal Vps.

Figure 11:
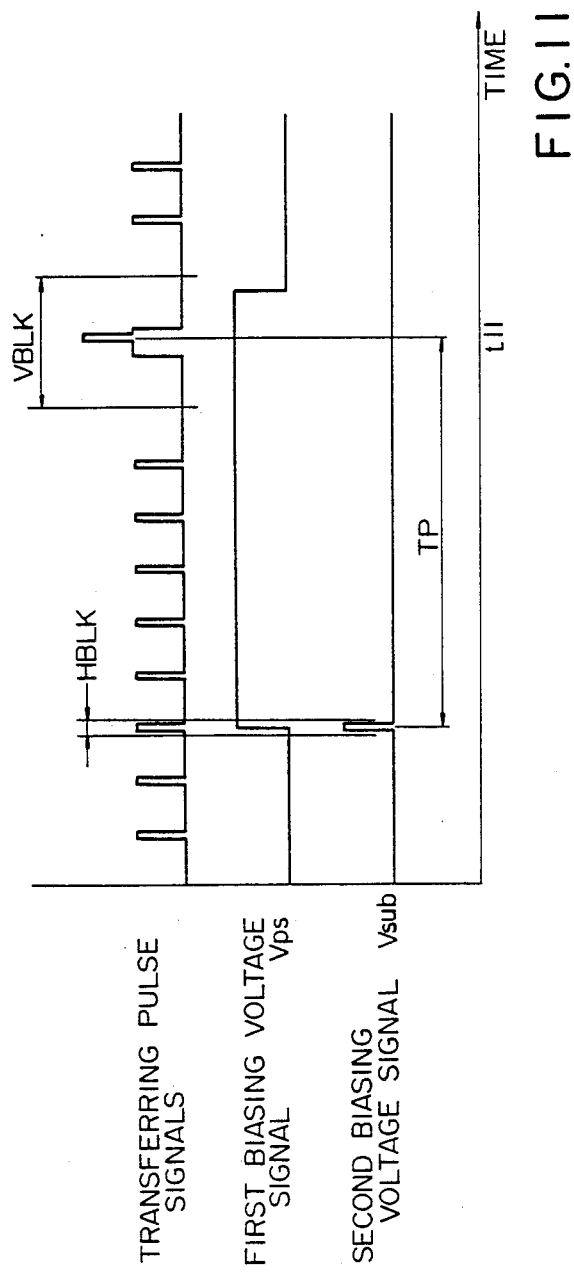
FIG. 11 is a timing chart showing a part of the essential signals so as to describe the relation between the first and second biasing voltage signals and the horizontal blanking period.

Description is made for the behavior of the image sensor with reference to FIG. 10 and, concurrently with FIG. 11. The pulse producing circuit 101 produces the vertical transferring pulse signal VPL between two vertical blanking periods, and the vertical driving pulse signal VD is supplied to the first monostable multivibrator circuit MM1. The first and second monostable multivibrator circuits MM1 and MM2 are activated in a cascade fashion, but the D-type latch circuit DFF never produces the high level output signal until the horizontal driving signal HD takes place at the clock node thereof. As will be understood from FIG. 11, the D-type latch circuit DFF is triggered with the horizontal driving signal HD in the horizontal blanking period HBLK, and the high level output signal of the second monostable multivibrator circuit MM2 is latched by the D-type latch circuit DFF, then the first amplifier circuit AM1 shifts the second biasing voltage signal Vsub into an extremely high positive voltage level at time t10. The high level output signal of the D-type latch circuit DFF is further supplied to the third monostable multivibrator circuit MM3, so that the third monostable monostable multivibrator circuit MM3 allows the second amplifier circuit AM2 to shift the first biasing voltage signal Vps from a negative low voltage level to a positive high voltage level. The positive high voltage level applied to the photo shield plate 118 promotes the production of the electric charges; however, the negative low voltage level restricts the photo-electric conversion. In this instance, the positive high voltage level and the negative low voltage level are about $+8$ volts and $-8$ volts, respectively. When the second biasing voltage signal Vsub goes up to the extremely high voltage level, the punch-through phenomenon takes place in the vertical overflow drain OFD, and ineffectual electric charges are discharged from the photo diodes PD11 to PDmn to the silicon substrate 100. The punch-through phenomenon takes place under the affection of the first biasing voltage level Vps of the negative low voltage level, and the extremely high voltage level of about $+20$ volts is sufficient to sweep the ineffectual electric charges into the silicon substrate 100. The second biasing voltage signal Vsub is recovered to an usual voltage level of about 10 volts upon completion of the sweeping operation.

When the first biasing voltage signal Vps goes up to the positive high voltage level, the image sensor is established into an electronic shutter mode of operation. If a read out pulse signal RD takes place at time t11, the electronic shutter mode of operation is terminated. The electronic shutter mode of operation continues over a time period TP. As described hereinbefore, since the second biasing voltage level Vsub of the extremely high voltage level allows the ineffectual electric charges to pass through the vertical overflow drain OFD, fresh or effectual electric charges are accumulated in the electric shutter mode of operation, and the effectual electric charges are read out to the vertical shift registers at time t11 in the presence of the read out signal RD. No undesirable noise appears on an associated display screen because the first biasing voltage signal Vps is shifted in the horizontal blanking period HBLK.

After a certain time period, the high level output signal of the third monostable multivibrator circuit MM3 is recovered to the low voltage level, and, accordingly, the first biasing voltage signal Vps is shifted to the negative low voltage level. It is desirable for the first biasing voltage signal Vps to be recovered into the negative low voltage level after the production of the read out signal RD but in the vertical blanking period, because the alternation is causative of the undesirable noises. The shutter speed is variable because the second biasing voltage signal rises in synchronization with the horizontal driving signal HD. In this instance, the shutter speed ranges from a sixtieth second to less than a thousandth second.

Second embodiment

Figure 12:
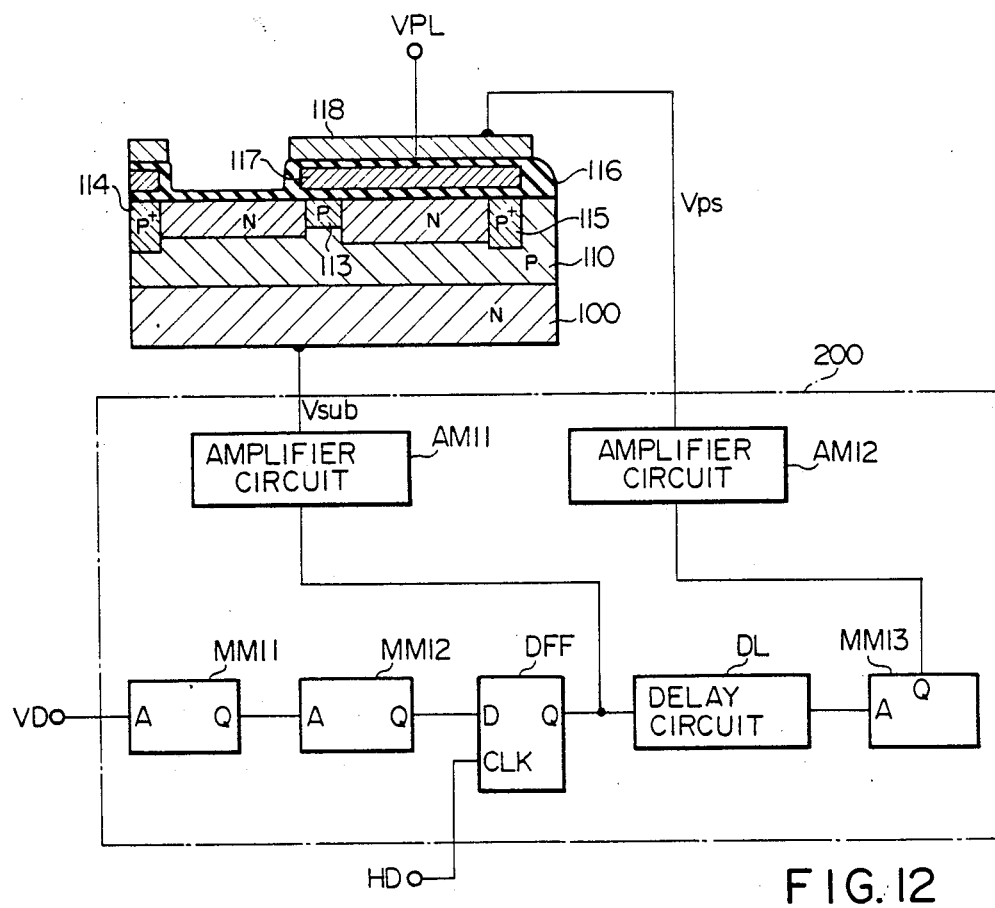
FIG. 12 is a view showing the arrangement of another biasing voltage controlling circuit according to the present invention.

Turning to FIG. 12, another image sensor is illustrated, and the component regions and elements thereof are designated by the same reference numerals used in FIG. 9 without any description.

The image sensor shown in FIG. 12 is associated with a biasing voltage controlling circuit 200 which comprises three monostable multivibrator circuits MM11, MM12 and MM13, a D-type latch circuit DFF, a delay circuit DL and two amplifier circuits AM11 and AM12. The delay circuit introduces a time delay into propagation of the high level output signal of the D-type latch circuit DFF by a time interval T20 between two horizontal blanking periods, and, for this reason, the second biasing voltage signal Vsub takes place in a first horizontal blanking period HBLK1, but the first biasing voltage signal Vps shifts its voltage level in the subsequent horizontal blanking period HBLK2. The first biasing voltage signal Vps is recovered in the vertical blanking period VBLK, so that the electronic shutter mode of operation continues over a time period T21.

Although particular embodiments of the present invention have been shown and described, it will be obvious to those skilled in the art that various changes and modifications may be made without departing from the spirit and scope of the present invention.

What is claimed is:

1. An image sensor fabricated on a semiconductor substrate of a first conductivity type and having at least an electronic shutter mode and a charge transferring mode of operation, comprising:
    (a) a plurality of photo sensing elements arranged in rows and columns and operative to accumulate effectual electric charges in said electronic shutter mode of operation and ineffectual electric charges out of the electronic shutter mode of operation in the presence of optical images, said photo sensing elements being respectively formed by a plurality of impurity regions of said first conductivity type defined in a well of a second conductivity type provided in said semiconductor substrate, said second conductivity type being opposite to said first conductivity type;
    (b) a plurality of vertical shift registers coupled to the columns of said photo sensing elements, respectively, and operative to receive said effectual electric charges from said photo sensing elements in the presence of a read out signal produced in a vertical blanking time period and to transfer said effectual electric charges in response to a multi-phase vertical transferring signal in said charge transferring mode of operation, said vertical shift registers being formed in said well;
    (c) a horizontal shift registor coupled to said vertical shift registors for transferring said effectual electric charges fed from said vertical shift registors in response to a multiple-phase horizontal transferring signal; and
    (d) a conductive photo shield plate provided over said well and having an opening exposing said photo sensing elements to said optical images, in which said image sensor is provided in association with a biasing voltage controlling unit responsive to a vertical driving signal and a horizontal driving signal and operative to produce a first biasing voltage signal fed to said photo shield plate and a second biasing voltage signal fed to said semiconductor substrate, said first biasing voltage signal shifting its voltage level from a first level to a second level at a first time and from the second level to the first level at a second time, said second biasing voltage signal momentarily shifting its voltage level between a third level and a fourth level at a third time so as to allow a punch-through phenomenon to take place between said semiconductor substrate and said photo sensing elements for discharging said ineffectual electric charges into the semiconductor substrate, said image sensor entering into said electronic shutter mode of operation from said third time to said second time, and in which said first level restricts the production of ineffectual electric charges but said second level promotes the production of said effectual electric charges.

2. An image sensor as set forth in claim 1, in which said first and third times take place in a horizontal blanking period.

3. An image sensor as set forth in claim 2, in which said biasing voltage controlling unit comprises a first monostable multivibrator circuit supplied with said vertical driving signal, a second monostable multivibrator circuit coupled to the first monostable multivibrator circuit, a D-type latch circuit having an input node coupled to the second monostable multivibrator circuit and a clock node supplied with said horizontal driving signal, a first amplifier circuit coupled to the output node of the D-type latch circuit for producing said second biasing voltage signal, a third monostable multivibrator circuit coupled to the output node of the D-type latch circuit and a second amplifier circuit coupled to an output node of the third monostable multivibrator circuit for producing said first biasing voltage signal.

4. An image sensor as set forth in claim 3, in which said second time takes place in said vertical blanking period.

5. An image sensor as set forth in claim 1, in which said third time and said first time take place in a first horizontal blanking period and in a second horizontal blanking period after the first horizontal blanking period respectively.

6. An image sensor as set forth in claim 5, in which said biasing voltage controlling unit comprises a first monostable multivibrator circuit supplied with said vertical driving signal, a second monostable multivibrator circuit coupled to the first monostable multivibrator circuit, a D-type latch circuit having an input node coupled to the second monostable multivibrator circuit and a clock node supplied with said horizontal driving signal, a first amplifier circuit coupled to the output node of the D-type latch circuit for producing said second biasing voltage signal, a delay circuit coupled to the output node of the D-type latch circuit, a third monostable multivibrator circuit coupled to the output node of the delay circuit and a second amplifier circuit coupled to an output node of the third monostable multivibrator circuit for producing said first biasing voltage signal.

7. An image sensor as set forth in claim 6, in which said second time takes place in said vertical blanking period.

* * * * *